(12) United States Patent
Yang

(10) Patent No.: US 7,862,986 B2
(45) Date of Patent: Jan. 4, 2011

(54) PATTERNING PROCESS

(75) Inventor: Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 536 days.

(21) Appl. No.: 11/874,039

(22) Filed: Oct. 17, 2007

(65) Prior Publication Data
US 2009/0104564 A1  Apr. 23, 2009

(51) Int. Cl.
G03F 7/26 (2006.01)
(52) U.S. Cl. ........................... 430/313; 430/394
(58) Field of Classification Search .............. 430/311, 430/322, 312, 394, 330, 270.1, 331
See application file for complete search history.

(56) References Cited

U.S. PATENT DOCUMENTS

| | | | |
|---|---|---|---|
| 5,686,223 A | * | 11/1997 | Cleeves ................ 430/312 |
| 6,943,124 B1 | | 9/2005 | Lu et al. |
| 2003/0216026 A1 | | 11/2003 | Mukherjee-Roy et al. |
| 2005/0148170 A1 | | 7/2005 | Bhave et al. |
| 2006/0216649 A1 | | 9/2006 | Paxton et al. |

FOREIGN PATENT DOCUMENTS

| | | | |
|---|---|---|---|
| JP | 2004-054286 | * | 2/2004 |
| TW | I224363 | | 11/2004 |

* cited by examiner

Primary Examiner—Kathleen Duda
Assistant Examiner—Caleen O Sullivan
(74) Attorney, Agent, or Firm—J.C. Patents

(57) ABSTRACT

The invention is directed to a method for patterning a material layer. The method comprises steps of forming a mask layer on the material layer. A multiple patterning process is performed on the mask layer for transferring at least a first pattern from a first photomask through a first photoresist and a second pattern from a second photomask from a second photoresist layer into the mask layer without performing any etching process. The mask layer exposes a portion of the material layer and the mask layer is patterned at the time that the first photoresist layer and the second photoresist layer are developed respectively. An etching process is performed to pattern the material layer by using the mask layer as an etching mask.

17 Claims, 6 Drawing Sheets

PATTERNING PROCESS

BACKGROUND OF THE INVENTION

1. Field of Invention

The present invention relates to a patterning process. More particularly, the present invention relates to a multiple patterning process.

2. Description of Related Art

In the manufacture of integrated circuit, photolithography process is used to transfer patterns from a photo mask having customized circuit patterns to thin films formed on a wafer. The image transfer process comprises steps of forming a photoresist layer on a material layer, illuminating the photoresist layer through a photomask having the customized circuit patterns, developing the photoresist layer and then etching the material layer by using the patterned photoresist layer as a mask. Hence, the image transfer process is accomplished. For a well-manufactured integrated circuit product, the image transfer process mentioned above is performed several times to transfer the circuit patterns to each non-process layers to form the electrically circuit device.

Conventionally, in order to increase the integration of the device elements without being limited by the resolution of the optical tool, a double patterning process is developed. In the double patterning process, a mask layer is formed on the material layer and is patterned twice with using different photomasks. On the other words, the formation of photoresist layer, the exposure-developing process and the etching process for patterning the mask layer are repeatedly in sequence to transfer two different patterns into the mask layer. Then, by using the patterned mask layer, the material layer is pattern so as to transfer the pattern on the patterned mask layer into the material layer. Thus, the pattern in the mask layer possesses smaller pitch than the patterns of the photomasks. However, in the conventional double patterning process, the etching process should be performed several times. Therefore, the process procedure is complex and the throughput is decreased.

SUMMARY OF THE INVENTION

Accordingly, the present invention is to provide a method for patterning a material layer capable of simplifying the process procedure.

The present invention also provides a method for patterning a material layer capable of decreasing the pitch of the device element.

To achieve these and other advantages and in accordance with the purpose of the invention, as embodied and broadly described herein, the invention provides a method for patterning a material layer. The method comprises steps of forming a mask layer on the material layer and forming a first photoresist layer on the mask layer. A first exposure process is performed on the first photoresist layer. A first develop process is performed to remove the exposed first photoresist layer together with a portion of the mask layer exposed by the exposed first photoresist layer to form a first pattern of a first pitch. The first photoresist layer is removed. A second photoresist layer is formed and a second exposure process is performed on the second photoresist layer. A second develop process is performed to remove the exposed second photoresist layer together with a portion of the mask layer exposed by the second photoresist layer to form a second pattern of a second pitch, wherein the second pitch is less than the first pitch. The second photoresist layer is removed and the material layer is patterned by using the second pattern as a mask.

According to one embodiment of the present invention, the second pattern is used to form at least one trench in the material layer. Further, the second pitch is smaller than the optical resolution during each of the first and the second exposure processes.

According to one embodiment of the present invention, the mask layer is made of a bottom anti-reflection coating material. Also, the bottom anti-reflection coating material is dissolved during both of the first and the second develop processed and is not dissolved during the first and the second photoresist layers are removed.

The invention also provides a method for patterning a material layer. The method comprises steps of forming a mask layer on the material layer and forming a first photoresist layer on the mask layer. A first exposure process is performed on the first photoresist layer and a first develop process is formed to remove the exposed first photoresist layer together with a portion of the mask layer exposed by the first photoresist layer to form a first pattern of a first pitch. The first photoresist layer is removed and the mask layer is hardened. A second photoresist layer is formed and a second exposure process is performed on the second photoresist layer. A second develop process is performed to remove the exposed second photoresist layer and the remaining second photoresist layer and the mask layer together form a second pattern of a second pitch less than the first pitch. The material layer is patterned by using the second pattern as a mask.

According to one embodiment of the present invention, the second pattern is used to form at least one line of the material layer. Further, the second pitch is smaller than the optical resolution during each of the first and the second exposure processes.

According to one embodiment of the present invention, the mask layer is made of a bottom anti-reflection coating material. Also, the bottom anti-reflection coating material is dissolved during both of the first and the second develop processed and is not dissolved during the first and the second photoresist layers are removed.

The invention further provides a method for patterning a material layer. The method comprises steps of forming a mask layer on the material layer. A multiple patterning process is performed on the mask layer for transferring at least a first pattern from a first photomask through a first photoresist and a second pattern from a second photomask from a second photoresist layer into the mask layer without performing any etching process. The mask layer exposes a portion of the material layer and the mask layer is patterned at the time that the first photoresist layer and the second photoresist layer are developed respectively. An etching process is performed to pattern the material layer by using the mask layer as an etching mask.

According to one embodiment of the present invention, the multiple patterning process further comprises steps of forming the first photoresist layer on the mask layer. The first photoresist layer is patterned by using the first photomask and developing the first photoresist layer to remove a portion of the first photoresist layer together with a portion of the mask layer exposed by the first photoresist layer. Then, the first photoresist layer is removed and a second photoresist layer is formed on the mask layer having the first pattern therein. The second photoresist layer is patterned by using the second photomask and developing the second photoresist layer to remove a portion of the second photoresist layer together with a portion of the mask layer exposed by the second photoresist layer. The second photoresist layer is removed.

According to one embodiment of the present invention, after the second photoresist layer is removed, the multiple patterning process further comprises steps of hardening the mask layer and forming a third photoresist layer with a third pattern on the portion of the material layer exposed by the mask layer. Thus, the third photoresist layer and the mask layer together form the etching mask. Also, a fourth pattern of the etching mask is a combination pattern of the first pattern, the second pattern and the third pattern.

According to one embodiment of the present invention, a fourth pattern of the etching mask is a combination pattern of the first pattern and the second pattern. Also, a pitch of the fourth pattern is smaller than the optical resolution of the multiple patterning process.

According to one embodiment of the present invention, the first pattern is different from the second pattern.

According to one embodiment of the present invention, the mask layer is made of a bottom anti-reflection coating material. Also, the bottom anti-reflection coating material is dissolved in a developer used for patterning the first photoresist layer and the second photoresist layer and is not dissolved in a stripping solvent for removing the first photoresist layer and the second photoresist layer.

In the present invention, the mask layer possesses the ability to be dissolved in the developer together with a portion of the photoresist layer, the process for patterning a material layer can be performed without performing the etching process more than one time. Therefore, the process procedure of the multiple patterning process is simplified and the throughput is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
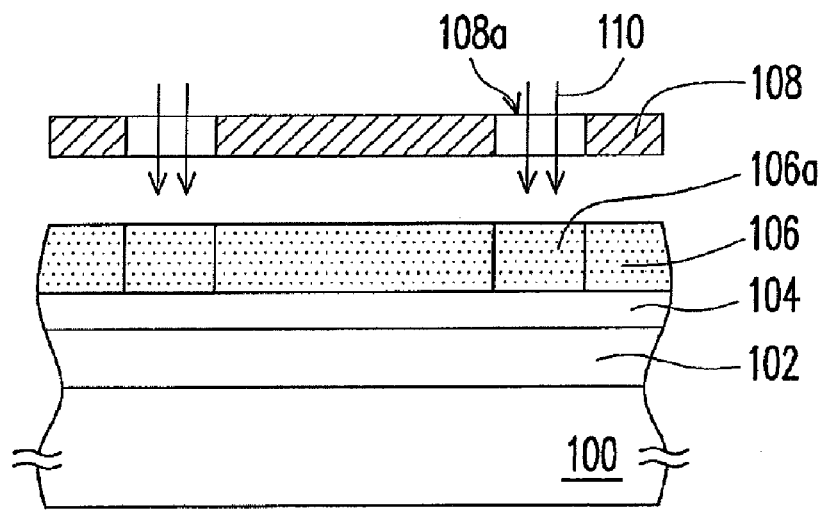
FIGS. 1A through 1F are cross-sectional views showing a multiple patterning process for patterning a material layer according to one embodiment of the invention.

FIGS. 1A through 1F are cross-sectional views showing a multiple patterning process for patterning a material layer according to one embodiment of the invention. As shown in FIG. 1A, a substrate 100 having a material layer 102 formed thereon is provided. Between the substrate 100 and the material layer 102, there are several inter-layers (not shown). For simplifying the drawings, the inter-layers are not shown in the figures. It should be noticed that the material layer 102 can be, for example but not limited to, formed of polymer, dielectric material, such as silicon oxide or silicon nitride, or other material according to the practical requirement.

Then, as shown in FIG. 1A, a mask layer 104 is formed on the material layer 102. The mask layer 104 is an anti-reflection mask layer. That is, the mask layer 104 is not only a mask layer for the later performed patterning process of the material layer but also an anti-reflection layer for the later performed photolithography process. Moreover, the mask layer 104 can be, for example but not limited to, made from developable bottom anti-reflection coating (developable BARC) material. That is, the mask layer 104 possesses the ability to be dissolved in the developer under certain operation condition. While the operation temperature is about 160~190° C. after BARC baking, the developable BARC can be dissolved in the developer and cannot be dissolved in the stripping solvent for removing the photoresist layer. It should be noticed that the stripping solvent for removing the photoresist layer can be, for example but not limited to, formed of propylene glycol methyl ether acetate (PGMEA), ethyl lactate (EL), methyl amyl ketone (MAK), propylene glycol monomethyl ether (PGME), or other material according to the practical requirement.

Still referring to FIG. 1A, a multiple patterning process is performed. In this embodiment, the multiple patterning process is represented by transferring two patterns into the mask layer 104 sequentially. However, the present invention is not limited by the number of the patterns transferred into the same mask layer. In the multiple patterning process, a first photoresist layer 106 is formed on the mask layer 104. In this embodiment, the first photoresist layer 106 is made of a positive type photoresist. However, the present invention is not limited by the material of the first photoresist layer 106 mentioned above. A first exposure process 110 with the use of a first photomask 108 having a first pattern 108a is performed on the first photoresist layer 106. Therefore, a portion of the first photoresist layer labeled as 106a is exposed.

Figure 1B:
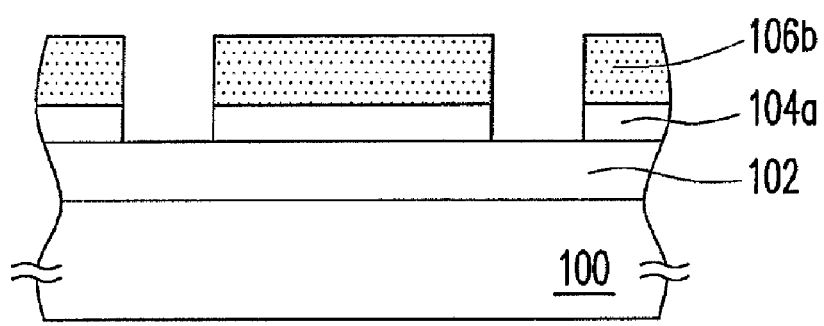

As shown in FIG. 1B, a first develop process is performed to remove the exposure portion of the first photoresist layer 106a together with a portion of the mask layer 104 exposed by the first photoresist layer 106b without being dissolved in a developer. That is, at the time of dissolving the exposure portion of the first photoresist layer 106a in the developer, the portion of the mask layer 104 right under the exposure portion of the first photoresist layer 106a is dissolved in the developer as well. Thus, the mask layer 104 is transformed into a preliminary pattern mask layer 104a exposing a portion of the material layer 102.

Figure 1C:
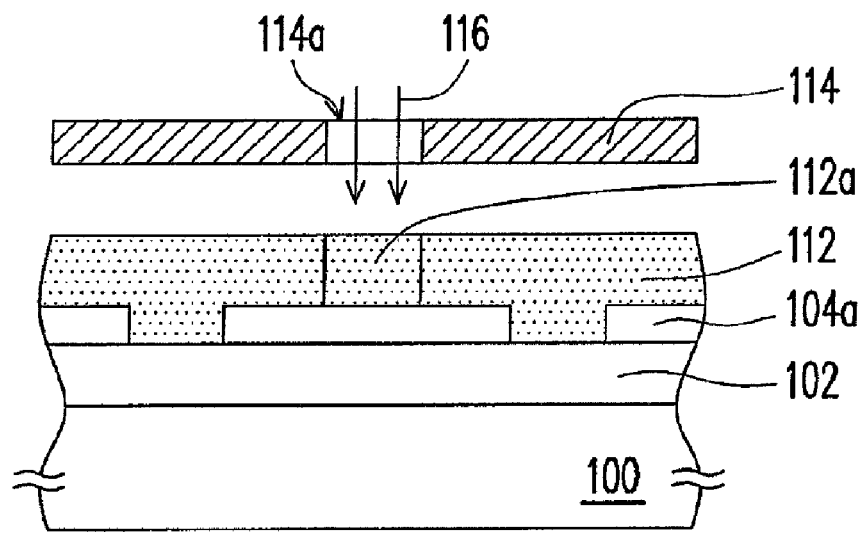

As shown in FIG. 1C, the first photoresist layer 106b is removed. Since the mask layer 104a, the preliminary pattern mask layer 104a, is not dissolved in the stripping solvent for removing the first photoresist layer 106b, the preliminary pattern mask layer 104a remains on the material layer 102. Then, a second photoresist layer 112 is formed on the preliminary pattern mask layer 104a. In this embodiment, the second photoresist layer 112 is made of a positive type photoresist. However, the present invention is not limited by the material of the second photoresist layer 112 mentioned above. A second exposure process 116 with the use of a second photomask 114 having a second pattern 114a is performed on the second photoresist layer 112. Therefore, a portion of the second photoresist layer labeled as 112a is exposed. It should be noticed that the first pattern 108a of the first photomask 108 is different from the second pattern 114a of the second photomask 114.

Figure 1D:
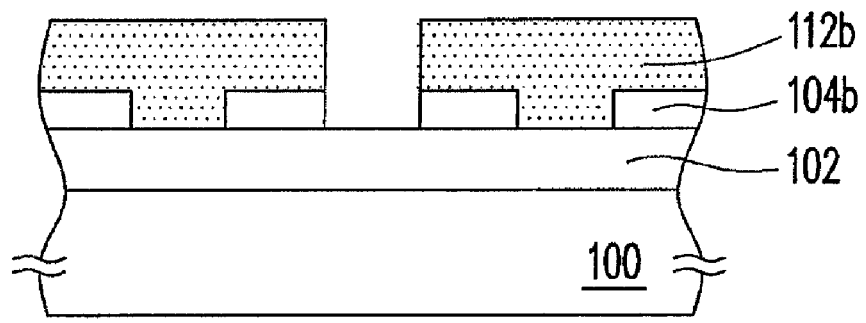

As shown in FIG. 1D, a second develop process is performed to remove the exposure portion of the second photoresist layer 112a together with a portion of the preliminary pattern mask layer 104a exposed by the second photoresist layer 112b without being dissolved in a developer. That is, at the time of dissolving the exposure portion of the second photoresist layer 112a in the developer, the portion of the preliminary pattern mask layer 104a right under the exposure portion of the second photoresist layer 112a is dissolved in the developer as well. Thus, the preliminary pattern mask layer 104a is transformed into an etching mask layer 104b exposing a portion of the material layer 102.

Figure 1E:
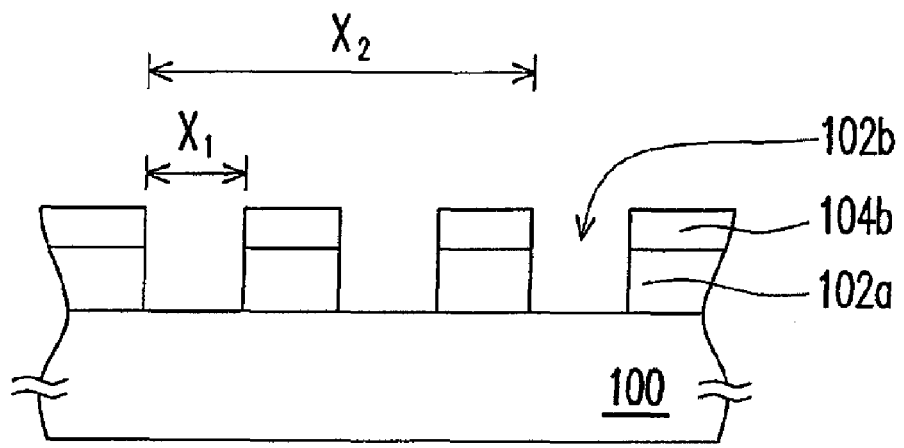

As shown in FIG. 1E, the second photoresist layer 112b is removed. Since the etching mask layer 104b is not dissolved in the stripping solvent for removing the second photoresist layer 112b, the etching mask layer 104b remains on the material layer 102. Then, an etching process is performed to pattern the material layer 102 by using the etching mask layer 104b as a mask. Thus, the pattern in the etching mask layer 104b is transferred into the material layer 102 and the material layer 102 is transformed into a patterned material layer 102a. It should be noticed that the pattern in the etching mask layer 104b is a combination pattern of the first pattern 118a and the second pattern 114a. Moreover, the pitch x1 of the pattern in the etching mask layer 104b is smaller than the optical resolution x2 during each of the first exposure process 110 and the second exposure process 116.

Figure 1F:
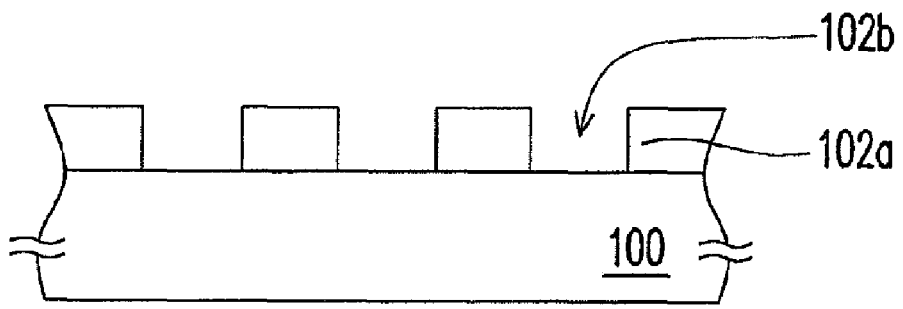

As shown in FIG. 1F, the etching mask layer 104b is removed. In this embodiment, the pattern in the etching mask layer 104b can be, for example but not limited to, a trench pattern for forming at least one trench 102b in the material layer 102a.

Figure 2A:
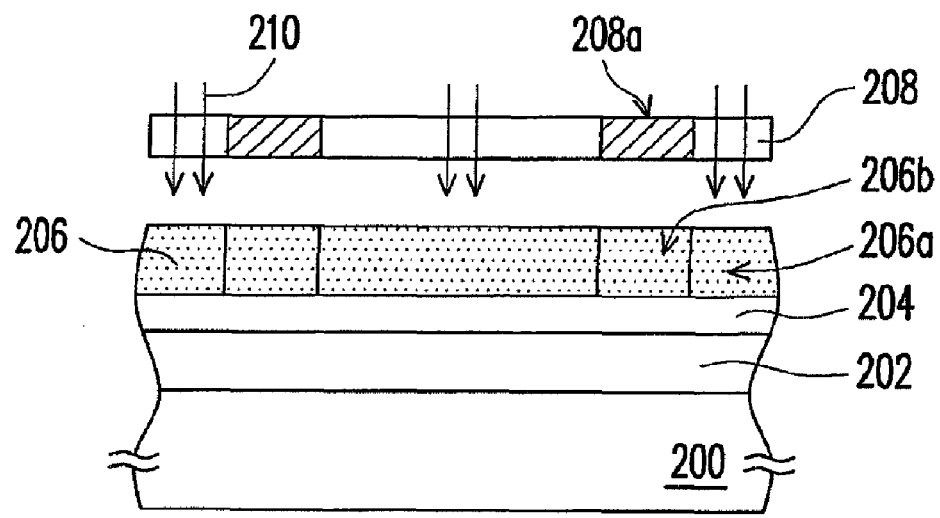
FIGS. 2A through 2F are cross-sectional views showing a multiple patterning process for patterning a material layer according to another embodiment of the invention.

FIGS. 2A through 2F are cross-sectional views showing a multiple patterning process for patterning a material layer according to another embodiment of the invention. As shown in FIG. 2A, a substrate 200 having a material layer 202 formed thereon is provided. Between the substrate 200 and the material layer 202, there are several inter-layers (not shown). For simplifying the drawings, the inter-layers are not shown in the figures. It should be noticed that the material layer 202 can be, for example but not limited to, formed of polymer, dielectric material, such as silicon oxide or silicon nitride, or other material according to the practical requirement.

Then, as shown in FIG. 2A, a mask layer 204 is formed on the material layer 202. The mask layer 204 is an anti-reflection mask layer. That is, the mask layer 204 is not only a mask layer for the later performed patterning process of the material layer but also an anti-reflection layer for the later performed photolithography process. Moreover, the mask layer 204 can be, for example but not limited to, made from developable bottom anti-reflection coating (developable BARC) material. That is, the mask layer 204 possesses the ability to be dissolved in the developer under certain operation condition. While the operation temperature is about 160~190° C. after BRAC coating, the developable BARC can be dissolved in the developer and cannot be dissolved in the stripping solvent for removing the photoresist layer. It should be noticed that the stripping solvent for removing the photoresist layer can be, for example but not limited to, formed of propylene glycol methyl ether acetate (PGMEA), ethyl lactate (EL), methyl amyl ketone (MAK), propylene glycol monomethyl ether (PGME), or other material according to the practical requirement.

Still referring to FIG. 2A, a multiple patterning process is performed. In this embodiment, the multiple patterning process is represented by transferring two patterns into the mask layer 204 sequentially. However, the present invention is not limited by the number of the patterns transferred into the same mask layer. In the multiple patterning process, a first photoresist layer 206 is formed on the mask layer 204. In this embodiment, the first photoresist layer 206 is made of a positive type photoresist. However, the present invention is not limited by the material of the first photoresist layer 206 mentioned above. A first exposure process 210 with the use of a first photomask 208 having a first pattern 208a is performed on the first photoresist layer 206. Therefore, a portion of the first photoresist layer labeled as 206a is exposed.

Figure 2B:
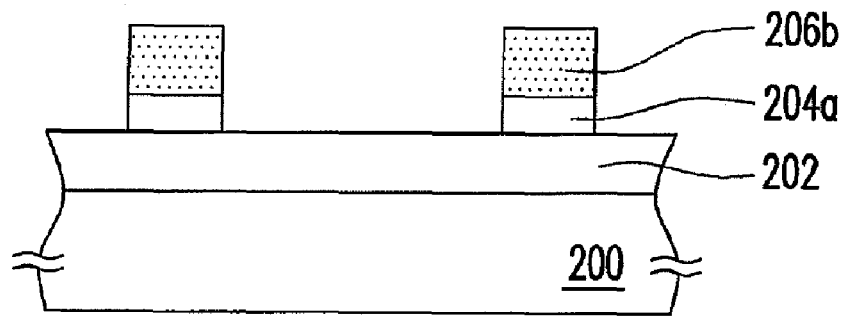

As shown in FIG. 2B, a first develop process is performed to remove the exposure portion of the first photoresist layer 206a together with a portion of the mask layer 204 exposed by the first photoresist layer 206b without being dissolved in a developer. That is, at the time of dissolving the exposure portion of the first photoresist layer 206a in the developer, the portion of the mask layer 204 right under the exposure portion of the first photoresist layer 206a is dissolved in the developer as well. Thus, the mask layer 204 is transformed into a preliminary pattern mask layer 204a exposing a portion of the material layer 202.

Figure 2C:
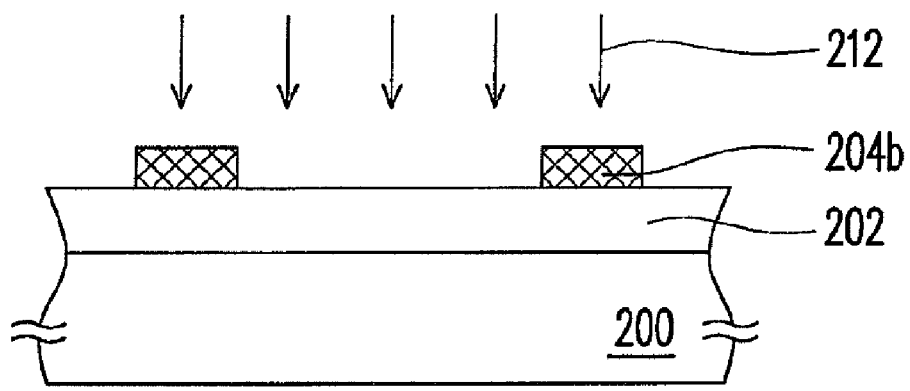

As shown in FIG. 2C, the first photoresist layer is removed. Since the mask layer 204a, the preliminary pattern mask layer 204a, is not dissolved in the stripping solvent for removing the first photoresist layer 206b, the preliminary pattern mask layer 204a remains on the material layer 202. Then, a treatment process 212 is performed to harden the preliminary pattern mask layer 204a. The temperature of the treatment process 212, in this embodiment, is at least about 210° C. and the treatment process 212 is performed about 60~240 seconds for hardening the preliminary pattern mask layer 204a into a preliminary pattern mask layer 204b.

Figure 2D:
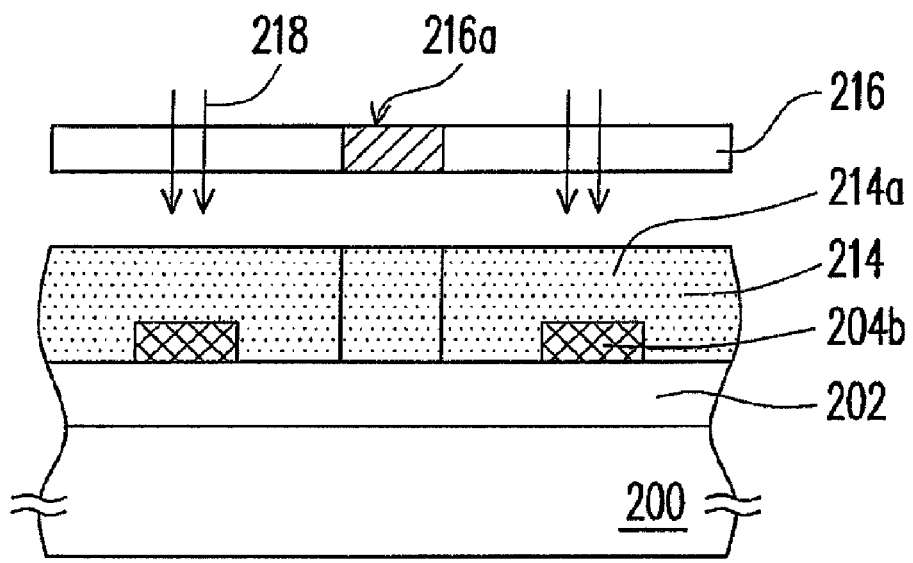

As shown in FIG. 2D, a second photoresist layer 214 is formed over the substrate 200. In this embodiment, the second photoresist layer 214 is made of a positive type photoresist. However, the present invention is not limited by the material of the second photoresist layer 214 mentioned above. A second exposure process 218 with the use of a second photomask 216 having a second pattern 216a is performed on the second photoresist layer 214. Therefore, a portion of the second photoresist layer labeled as 214a is exposed. It should be noticed that the first pattern 208a of the first photomask 208 is different from the second pattern 216a of the second photomask 216. In this embodiment, the second pattern 216a is located over a portion of the material layer 202 without having the first pattern 206b formed thereon.

Figure 2E:
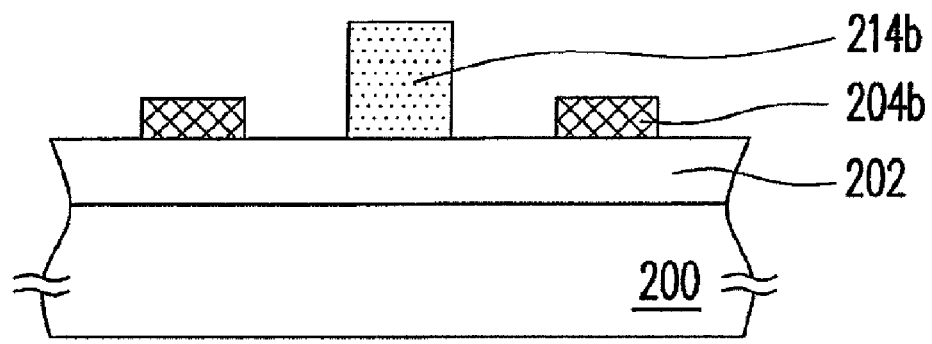

As shown in FIG. 2E, a second develop process is performed to remove the exposure portion of the second photoresist layer 214a. Since the preliminary pattern mask layer 204b had been harden before the second develop process is performed, the preliminary pattern mask layer 204b is not dissolved in the developer used in the second develop process. That is, the patterned second photoresist layer 214b after the second develop process is located on a portion of the material layer exposed by the preliminary pattern mask layer 204b. Thus, the preliminary pattern mask layer 204a is transformed into an etching mask layer 204b exposing a portion of the material layer 202.

Figure 2F:
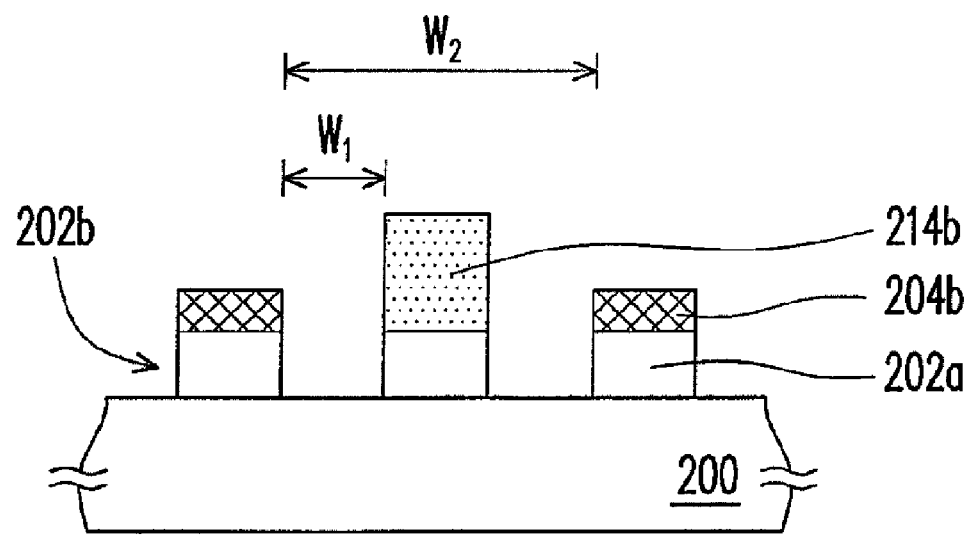

As shown in FIG. 2F, the material layer 202 is patterned by using the preliminary pattern mask layer 204b and the patterned second photoresist layer 214b as an etching mask. Therefore, the first pattern 208a from the first mask 208 and the second pattern 216a from the second mask 216 are transferred into the material layer 202. The material layer 202 is transformed into a material layer 202a with a third pattern 202b. Accordingly, the third pattern 202b is a combination pattern of the first pattern 208a and the second pattern 216a. In this embodiment, the third pattern composed of the preliminary pattern mask layer 204b and the patterned second photoresist layer 214b can be, for example but not limited to, a line pattern for forming at least one line in the material layer 202a. It should be noticed that since the third pattern 202b in the material layer 202a is a combination pattern of the first pattern 208a and the second pattern 216a, the pitch w1 of the third pattern 202b is smaller than the optical resolution w2 during each of the first exposure process 210 and the second exposure process 218.

In the present embodiment, before the patterned mask layer 204b is hardened, the mask layer 204 is pattern by being directly dipping into the developer once. That is, in the present embodiment of the invention, only one pattern is transferred into the mask layer before the mask layer made of the developable BARC material is hardened. However, the present invention is not limited by this embodiment. The present embodiment can be integrated with the previous embodiment. That is, before the patterned mask layer is hardened, the mask layer can be multiple patterned several times as mentioned in the previous embodiment (as shown in FIGS. 1A through 1D). Therefore, the pitch of the result device element can be decreased and the density of the device element is increased.

In the present invention, because of the use of the mask layer made of the developable BARC material, the process for patterning a material layer can be performed without performing the etching process more than one time. That is, the mask layer of the present invention possesses the ability to be dissolved in the developer while a portion of the photoresist layer is dissolved in the developer. Therefore, the process procedure of the multiple patterning process is simplified and the throughput is increased.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for patterning a material layer comprising:
    forming a mask layer on the material layer;
    forming a first photoresist layer on the mask layer;
    performing a first exposure process on the first photoresist layer;
    performing a first develop process to remove the exposed first photoresist layer together with a portion of the mask layer exposed by the exposed first photoresist layer to form a first pattern of a first pitch;
    removing the first photoresist layer;
    forming a second photoresist layer;
    performing a second exposure process on the second photoresist layer;
    performing a second develop process to remove the exposed second photoresist layer together with a portion of the mask layer exposed by the second photoresist layer to form in the mask layer a second pattern of a second pitch that exposes a portion of the material layer, wherein the second pitch is less than the first pitch;
    removing the second photoresist layer;
    hardening the mask layer after the second photoresist layer is removed;
    forming a third photoresist layer with a third pattern on the portion of the material layer exposed by the second pattern, wherein the third photoresist layer and the second pattern together form a fourth pattern; and
    patterning the material layer by using the fourth pattern as an etching mask.

2. The method recited in claim 1, wherein the second pattern is used to form at least one trench in the material layer.

3. The method recited in claim 1, wherein the second pitch is smaller than the optical resolution during each of the first and the second exposure processes.

4. The method recited in claim 1, wherein the mask layer is made of a bottom anti-reflection coating material.

5. The method recited in claim 4, wherein the bottom anti-reflection coating material is dissolved during both of the first and the second develop processed and is not dissolved during the first and the second photoresist layers are removed.

6. A method for patterning a material layer comprising:
    forming a mask layer on the material layer;
    forming a first photoresist layer on the mask layer;
    performing a first exposure process on the first photoresist layer;
    performing a first develop process to remove the exposed first photoresist layer together with a portion of the mask layer exposed by the first photoresist layer to form a first pattern of a first pitch;
    removing the first photoresist layer;
    hardening the mask layer;
    forming a second photoresist layer;
    performing a second exposure process on the second photoresist layer;
    performing a second develop process to remove the exposed second photoresist layer, wherein the remaining second photoresist layer and the mask layer together form a second pattern of a second pitch less than the first pitch; and
    patterning the material layer by using the second pattern as a mask.

7. The method recited in claim 6, wherein second pattern is used to form at least one line of the material layer.

8. The method recited in claim 6, wherein the second pitch is smaller than the optical resolution during each of the first and the second exposure processes.

9. The method recited in claim 6, wherein the mask layer is made of a bottom anti-reflection coating material.

10. The method recited in claim 9, wherein the bottom anti-reflection coating material is dissolved during both of the first and the second develop processed and is not dissolved during the first and the second photoresist layers are removed.

11. A method for patterning a material layer, the method comprising:
    forming a mask layer on the material layer;
    performing a multiple patterning process on the mask layer for transferring at least a first pattern from a first photomask through a first photoresist layer and a second pattern from a second photomask through a second photoresist layer into the mask layer without performing any etching process, wherein the mask layer exposes a portion of the material layer, the mask layer is patterned at the time that the first photoresist layer and the second photoresist layer are developed respectively, and the second photoresist layer is removed after the mask layer is patterned;
    hardening the mask layer after the second photoresist layer is removed;
    forming a third photoresist layer with a third pattern on the portion of the material layer exposed by the mask layer, wherein the third photoresist layer and the mask layer together form a fourth pattern; and
    performing an etching process to pattern the material layer by using the fourth pattern as an etching mask.

12. The method recited in claim 11, wherein the multiple patterning process further comprises:
    forming the first photoresist layer on the mask layer;
    patterning the first photoresist layer by using the first photomask and developing the first photoresist layer to remove a portion of the first photoresist layer together with a portion of the mask layer exposed by the first photoresist layer;

removing the first photoresist layer;

forming a second photoresist layer on the mask layer having the first pattern therein;

patterning the second photoresist layer by using the second photomask and developing the second photoresist layer to remove a portion of the second photoresist layer together with a portion of the mask layer exposed by the second photoresist layer; and removing the second photoresist layer.

13. The method recited in claim 11, wherein the fourth pattern is a combination pattern of the first pattern, the second pattern and the third pattern.

14. The method recited in claim 11, wherein a pitch of a combination pattern of the first pattern and the second pattern is smaller than the optical resolution of the multiple patterning process.

15. The method recited in claim 11, wherein the first pattern is different from the second pattern.

16. The method recited in claim 11, wherein the mask layer is made of a bottom anti-reflection coating material.

17. The method recited in claim 16, wherein the bottom anti-reflection coating material is dissolved in a developer used for patterning the first photoresist layer and the second photoresist layer and is not dissolved in a stripping solvent for removing the first photoresist layer and the second photoresist layer.

* * * * *